United States Patent [19]

Chang et al.

[11] Patent Number: 5,504,364

[45] Date of Patent: Apr. 2, 1996

[54] CMOS LOCOS ISOLATION FOR SELF-ALIGNED NPN BJT IN A BICMOS PROCESS

[75] Inventors: Kuang-Yeh Chang, Los Gatos; Yi-Hen Wei, Saratoga, both of Calif.

[73] Assignee: VLSI Technology, Inc., San Jose, Calif.

[21] Appl. No.: 294,783

[22] Filed: Aug. 24, 1994

Related U.S. Application Data

[63] Continuation of Ser. No. 433, Jan. 4, 1993, abandoned.

[51] Int. Cl.$^6$ .......................... H01L 27/02; H01L 21/265
[52] U.S. Cl. .......................... 257/370; 257/377; 257/51;
257/506; 257/518; 257/519; 257/588; 257/592;
437/31; 437/34; 437/57; 437/63; 437/186;
437/233
[58] Field of Search .............................. 257/51, 370, 377,
257/506, 518, 19, 588, 592; 437/15, 31,
34, 57, 70, 71, 186, 233, 63

[56] References Cited

U.S. PATENT DOCUMENTS 4,727,046 2/1988 Tuntasood et al. .
4,912,055 3/1990 Min et al. .......................... 257/370
4,987,093 1/1991 Teng et al. .
5,023,192 6/1991 Josquin et al. .
5,023,193 6/1991 Manoliu et al. .
5,034,351 7/1991 Sun et al. .

OTHER PUBLICATIONS

Chen et al., An Advanced Bipolar Transistor with Self-Aligned Ion-Implanted Base and W/Poly Emitter, *IEEE Transactions on Electron Devices*, vol. 35(8); pp. 1322–1327, Aug. 1988.

Primary Examiner—Edward Wojciechowicz
Attorney, Agent, or Firm—Burns, Doane, Swecker & Mathis

[57] ABSTRACT

A method of fabricating BiCMOS devices, and the resultant BiCMOS device, are disclosed. According to the present invention, over-etching to the substrate on the deposited polysilicon emitter is prevented by providing additional oxide beneath a polysilicon layer as an etch stop. Despite inclusion of an oxide to define an end-point during patterning of an emitter, fabrication complexity is reduced by avoiding additional SAT masking and oxidation steps.

17 Claims, 3 Drawing Sheets

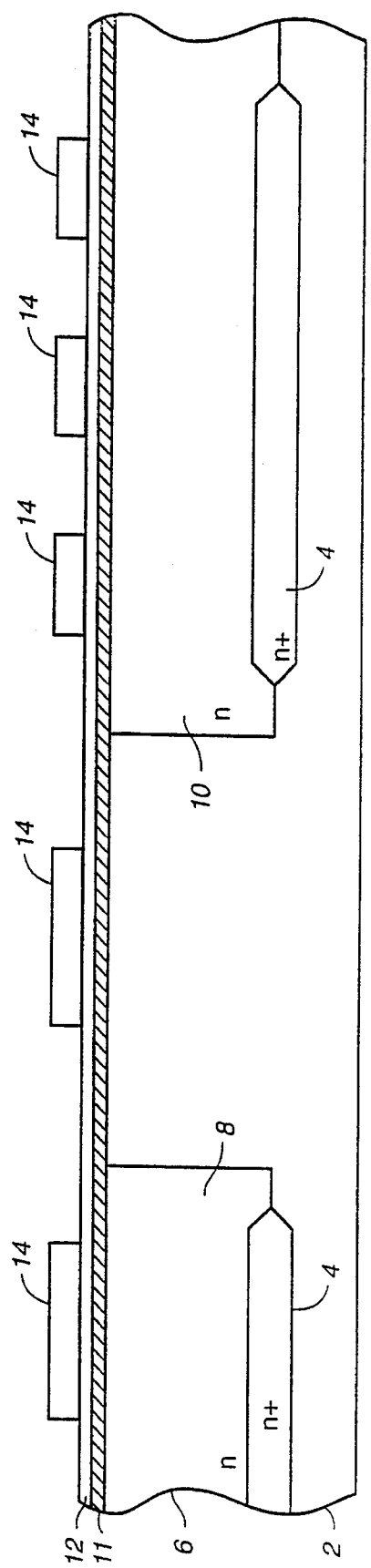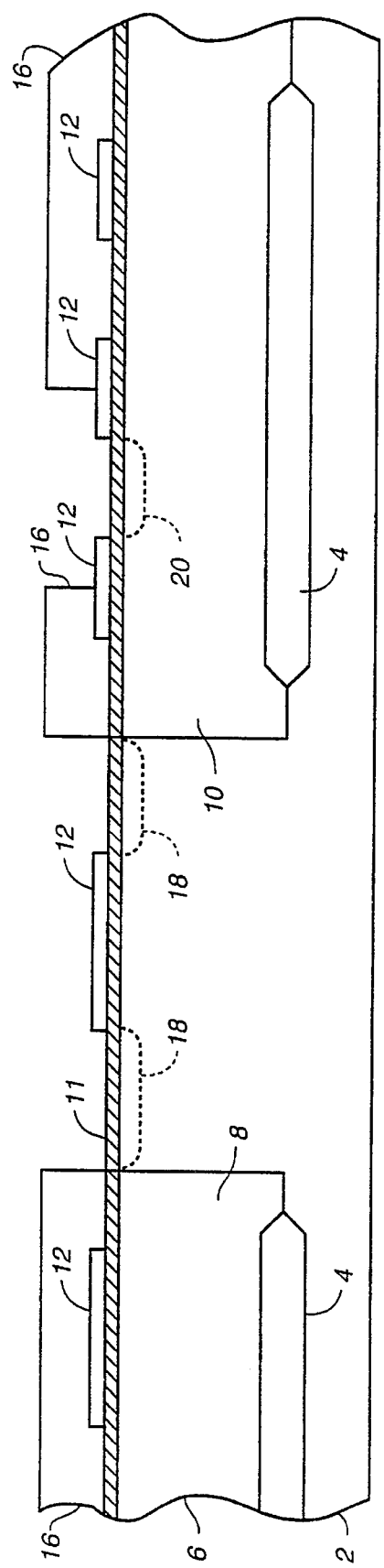

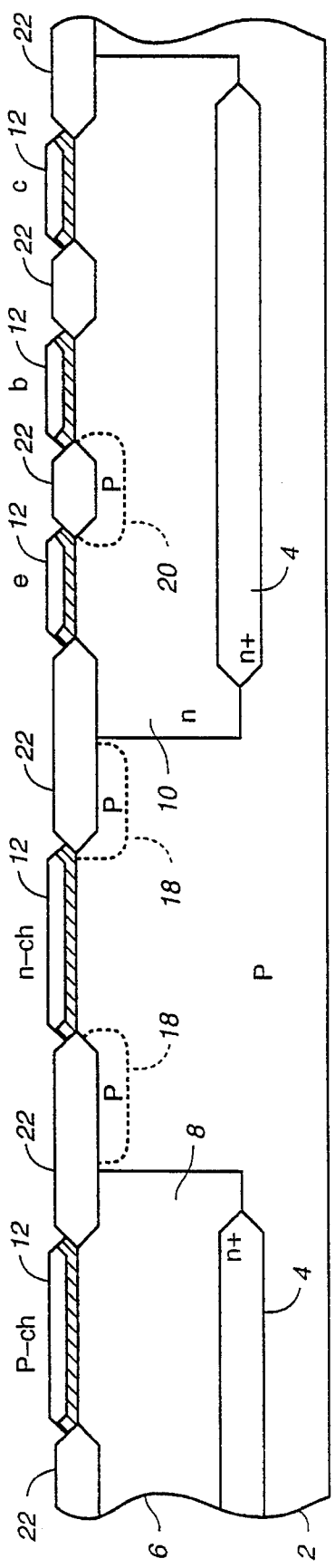
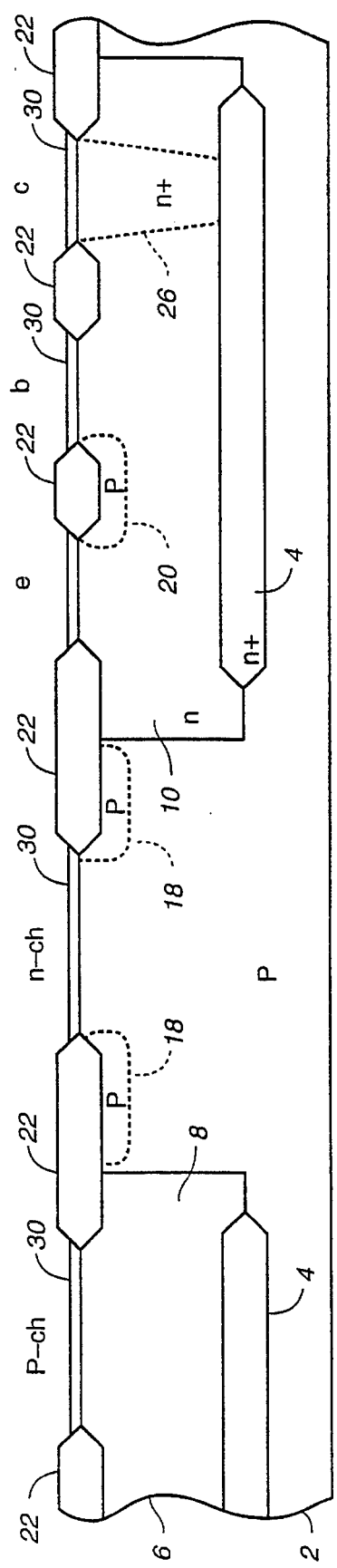
FIG._3
FIG._4

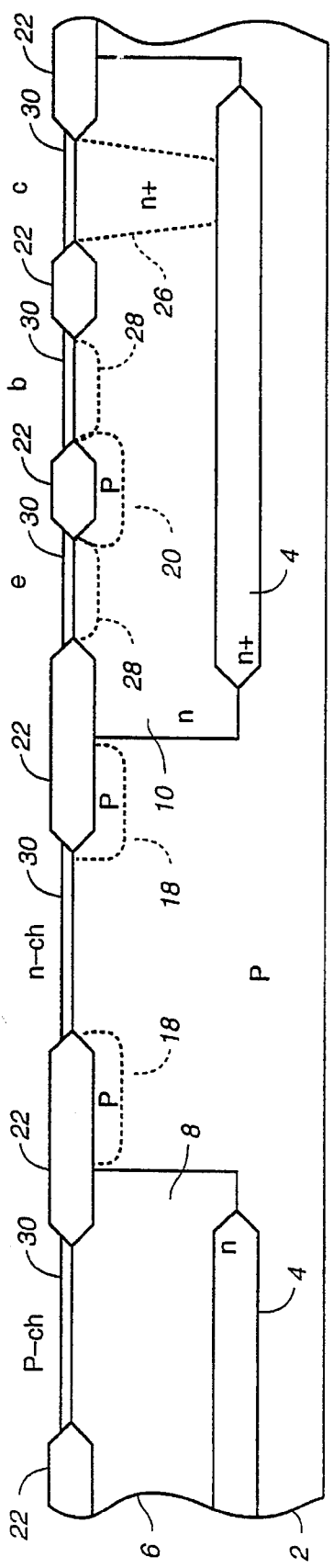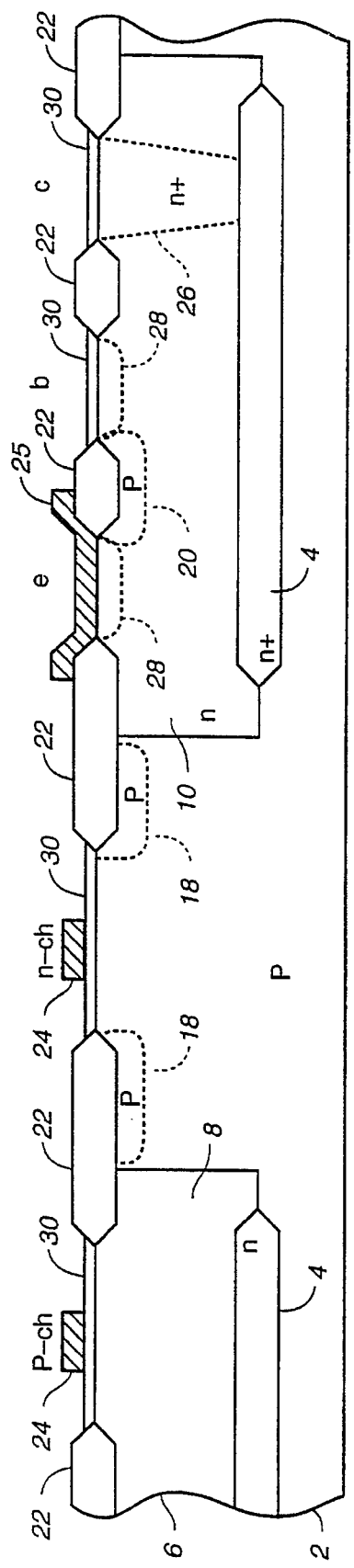
FIG._5    FIG._6

CMOS LOCOS ISOLATION FOR SELF-ALIGNED NPN BJT IN A BICMOS PROCESS

This application is a continuation of application Ser. No. 08/000,433, filed Jan. 4, 1993, now abandoned.

BACKGROUND OF THE INVENTION

1. Field of the Invention

The present invention relates generally to BiCMOS semiconductor fabrication methods and multilayer structures resulting from such methods. More particularly, the present invention relates to a method for preventing over-etching during BiCMOS fabrication without adding additional fabrication steps.

2. State of the Art

Semiconductor devices fabricated using CMOS and bipolar techniques have been used for decades to manufacture various electrical components. More recently hybrid semiconductor devices, fabricated using techniques known as BiCMOS processes, have been developed to combine the relatively high speed bipolar devices with the high density CMOS devices on a common substrate. BiCMOS devices are especially desirable as memory devices wherein high output bipolar drivers can be coupled with low power consumption CMOS memories.

Initially BiCMOS fabrication was achieved by performing all of the conventional process steps for both bipolar devices and CMOS devices. A bipolar device fabrication process is described in an article "An Advanced Bipolar Transistor With Self-Aligned Ion-Implanted Base and W/Poly Emitter", Chen et at., *IEEE Transactions On Electron Devices*, Vol. 35, No. 8, Aug. 1988. This resulted in a relatively costly manufacturing process which was susceptible to low yield due to the large number of process steps and increased likelihood of manufacturing errors. More recent efforts have been directed to integrating the bipolar fabrication process with the CMOS fabrication process by reducing the total number of process steps (e.g., masking steps).

One result of this consolidation of steps is that the gates of the CMOS devices and the emitters of the bipolar devices are often formed during a single step of depositing a polysilicon layer across the entire semiconductor surface. As described in more detail below, the polysilicon in the gate areas is deposited on a gate oxide layer overlying the silicon substrate. In the emitter areas of the bipolar transistors, however, the polysilicon is deposited directly on the epitaxial silicon since earlier fabrication steps require that the gate oxide in those areas be removed.

Next, the polysilicon is etched away from surface areas not designated as gates or emitters. In the gate areas, this presents no difficulties because the gate oxide under the polysilicon acts as a detectable end-point which indicates when etching should be discontinued to avoid etching the underlying epitaxial silicon. In the emitter areas, however, the interface between the polysilicon used to form the emitter and the epitaxial substrate (single crystalline silicon) is not readily detectable as an end-point. The effort to reduce the number of BiCMOS processing steps has resulted in avoiding the use of any readily detectable end-point material between the emitter polysilicon and the epitaxial base. Thus, etching often continues past the polysilicon layer and into the epitaxial silicon.

This over-etching reduces the vertical dimension of a bipolar transistor's extrinsic base which is formed in the epitaxial substrate beneath the emitter. Because the extrinsic base is typically formed with an exemplary vertical depth of only about a few thousand angstrom, such over-etching can result in a base which experiences electrical leakage during operation of the bipolar transistor and which undermines performance of the BiCMOS device. Nonetheless, such over-etching has been considered an acceptable design tradeoff given the other advantages of BiCMOS devices and the need to simplify the overall fabrication process.

SUMMARY OF THE INVENTION

In accordance with the present invention, a BiCMOS fabrication process which uses an oxidation step for forming CMOS field oxide regions to also form an oxide layer between a bipolar transistor's emitter and extrinsic base area without increasing fabrication complexity. This provides an end-point for the etching step used to pattern the polysilicon emitter, and prevents the over-etching problem discussed above. In exemplary embodiments, the step of forming the oxide layer is advantageously performed without adding an additional masking step to the BiCMOS fabrication process.

To permit the use of the CMOS field oxide layer as an endpoint between a bipolar transistor's emitter and extrinsic base, a mask which is used to define field oxide regions in the CMOS transistor areas of the BiCMOS device is also used to define a base link area between the extrinsic base and a base contact of the bipolar transistor. Further, an earlier, self aligned implant of the base link (i.e., between the intrinsic base and a base contact) is performed at the same time CMOS field implant regions (i.e., channel stops) are formed. Afterwards, the oxide layer is used for a self aligned extrinsic base implant. Thus, BiCMOS devices having improved characteristics can be produced without increasing the complexity of the fabrication process.

BRIEF DESCRIPTION OF THE DRAWINGS

Other advantages and objects of the present invention will become more apparent from the following detailed description of preferred embodiments when read in conjunction with the attached Figures, wherein like elements have been designated by like reference numerals, and wherein:

FIGS. 1–6 illustrate cross-sectional views of an exemplary BiCMOS device at various stages of a fabrication process according to an exemplary embodiment of the invention.

DETAILED DESCRIPTION OF THE PREFERRED EMBODIMENTS

A method of fabricating a BiCMOS device according to an exemplary embodiment of the invention is illustrated in FIGS. 1–6 which show cross-sectional views of an exemplary BiCMOS device at various stages of fabrication. An exemplary semiconductor substrate 2 composed of silicon is initially doped with a p-type conductivity dopant, such as boron or arsenic to create a substrate of a p-type conductivity.

Next, a mask is formed on the substrate 2 to expose openings over areas of the substrate where bipolar (e.g., npn) devices are to be formed. This mask, as well as the rest of the masks described herein, can be formed using photoresist and well known photolithography techniques. An n-type conductivity dopant, such as arsenic, is implanted through the mask openings to form a heavily doped, n+buried layer represented as region 4.

After the buried layer region 4 has been formed, the mask used to create the buried layer region is removed and a p-type epitaxial silicon layer 6 is grown or deposited on top of the substrate 2 with a thickness of, for example, about 1.5–3.0 microns. Next, a well mask is formed on the epitaxial layer 6 which covers areas where n-channel CMOS devices are to be formed and exposes areas where p-channel CMOS devices and bipolar devices are to be formed. After implanting an n-type conductivity dopant through the openings in the well mask, the dopants are driven into contact with the buried layer region, thus creating n well areas 8 and 10 in the epitaxial layer 6. This driving step can be performed, for example, by baking the substrate at approximately 1100° C.–1200° C. for about three to twenty hours.

Following creation of the n well areas 8 and 10, an initial oxidation 11 of the silicon is performed whereby a nitride layer 12 is initially deposited over the surface of the epitaxial layer 6 as illustrated in FIG. 1. A diffusion mask 14 is next formed and used to pattern (i.e., etch) the nitride layer such that the epitaxial layer 6 is exposed in areas where field oxide regions are to be later formed (e.g., grown). In this sense, the patterned nitride represents a mask for defining field oxide regions of CMOS devices. These field oxide regions function to electrically isolate different regions of the semiconductor from one another, and will be formed in the exposed areas of the substrate between the patterned nitride layer 12 as will be described with respect to FIG. 3. The nitride mask will also be used to define a base link region (i.e., between an extrinsic base and a base contact) of a bipolar transistor. Once formed, the field oxide regions are used as a self-aligned mask to define an area where an extrinsic base implant 28 (see FIG. 4) is to be formed in the substrate 2.

Returning to FIG. 1, the diffusion mask 14 is removed and a field implant mask 16 is formed and patterned over portions of the remaining nitride and exposed epitaxial layer 6 as shown in FIG. 2. Conventional BiCMOS devices were fabricated by sequentially providing a field implant mask with openings for channel stops over field implant regions, performing a field implant operation in the channel stop areas, providing a self-aligned transistor (i.e., SAT) mask with an opening over an area where a base link is to be created, and then performing a SAT implant for the base link. However, in an exemplary embodiment of the present invention, the field implant mask 16 exposes areas where channel stops are to be created (e.g., implanted between remaining portions of the nitride) in the n-channel CMOS device as well as an area in the bipolar device where the base link 20 is formed (e.g., implanted) between the base and emitter contacts. A field implant of a p-type conductivity dopant is then used to form the channel stops 18 and the base link 20 at the same time (i.e., prior to any additional masking steps) as shown in the exemplary FIG. 2 embodiment. However, it will be readily apparent to those skilled in the art that plural masking steps can alternately be used to form the channel stops and the base link using different type dopants of varying doses.

The field implant mask 16 is then stripped and field oxide regions 22 are grown on exposed areas of the epitaxial layer 6 (i.e., those not covered with nitride) as illustrated in FIG. 3. These oxide areas are used to define the active CMOS transistor areas as well as the emitter (e), collector (c) and extrinsic base and base regions (b) as will be described below. Thus, methods according to the present invention reduce the overall complexity of the manufacturing process by reducing the number of masking steps. The nitride 12 is then removed using suitable etchants.

A sink masking step and sink implant step (i.e., n+implant followed by high temperature drive) are performed to provide an n+connection region 26 between a contact which is later formed over the collector area (c) of the bipolar device and the buried layer region 4 as shown in FIG. 4. The sink mask is then removed and followed by the CMOS threshold voltage implant and gate oxidation 30 as shown in FIG. 4. A base masking step is provided to cover the surface of the device, exposing only the base area in the substrate. As mentioned above, the field oxide used to define the extrinsic base area serves as a self aligned mask for forming the base mask. A base implant step is performed by implanting a p-type conductivity dopant through the opening in the mask to create the bipolar extrinsic base 28 (FIG. 5). The gate oxide layer performs the function of insulating the polysilicon gates of the CMOS devices from the substrate. This insulation feature is not compatible with bipolar device fabrication, so a subsequent etching step is performed to remove the gate oxide layer in the area of the intrinsic base region as shown in FIG. 5. The base implant can be omitted if the CMOS threshold voltage implant can provide comparable dose and energy.

A polysilicon layer is then deposited over the entire surface of the device. A doping or implanting of the polysilicon can be used to lower the resistance of this layer. Both the gates 24 of the p-channel and n-channel CMOS devices and the emitter 25 of the bipolar device are substantially formed by masking and etching the polysilicon layer as shown in FIG. 6. Due to the additional oxide formed during the creation of field oxide regions, all portions of the polysilicon layer exposed by a patterned mask can be etched away without over-etching into the epitaxial layer. As can be seen in FIG. 6, the polysilicon used to form the emitter 25 is etched on the overgrown portions of oxide regions 22 to avoid over-etching into the extrinsic base. Because outer edges of the emitter 25 are patterned on the oxide 22, the polysilicon emitter need not be patterned in precise alignment with the extrinsic base 28. The remaining BiCMOS fabrication steps including, for example, CMOS gate spacer formation, implanting the heavily doped regions for sources and drains of the CMOS devices, forming collector and base contacts of the bipolar devices and so forth are well known in the art and can be performed using conventional techniques.

One skilled in the art will recognize that the present invention is adaptable to any method of fabricating any BiCMOS devices. Any conventional BiCMOS fabrication can be modified in accordance with the present invention to prevent over-etching by forming oxide over portions of the substrate where the extrinsic base of the bipolar device is to be formed. However, preferred BiCMOS fabrication processes and BiCMOS devices of the present invention, advantageously eliminate this over-etching without adding additional masking steps. This increases production efficiency and enhances device yield.

While the present invention has been described in the context of an exemplary embodiment, those skilled in the art will appreciate that the present invention can be embodied in other specific forms without departing from the spirit or essential characteristics thereof. Accordingly, the presently disclosed embodiments are considered in all respects to be illustrative rather than restrictive. The scope of the invention is indicated by the appended claims and all changes that come within the meaning and range of equivalents thereof are intended to be embraced therein.

What is claimed is:

1. A method of fabricating BiCMOS devices having both a bipolar device and a CMOS device formed on a common semiconductor substrate, said method comprising the steps of:

forming a single mask to define a field implant channel stop for a CMOS device and a base link region for a bipolar device, said base link region linking an extrinsic base of said bipolar device with a base contact;

implanting dopant into said channel stop and said base link region defined by said mask;

forming an oxide layer in a region of the CMOS device over said channel stop and in a region of the bipolar device over said base link; and patterning an emitter of said bipolar device over portions of said oxide layer.

2. The method of claim 1, wherein said step of forming a mask further includes a step of:

patterning a nitride layer over portions of said substrate, said nitride layer being used as a mask during said step of implanting.

3. The method of claim 2, wherein said step of forming an oxide layer further includes a step of:

growing oxide on portions of said substrate exposed by said patterned nitride.

4. The method of claim 3, wherein said step of implanting further includes a step of:

using the same dopant to form the channel stop and the base link region at the same time.

5. The method of claim 4 further comprising the steps of:

forming a polysilicon layer over said oxide layer; and patterning said emitter region from said polysilicon layer using said oxide layer as an etch end-point.

6. The method of claim 4, wherein said oxide layer defines an extrinsic base area of the bipolar device.

7. A method of fabricating a BiCMOS semiconductor structure comprising the steps of:

masking a substrate of a first conductivity-type to expose a portion of the substrate which defines a buried layer region;

implanting a second conductivity-type dopant into the buried layer region;

forming an epitaxial layer of semiconductor material over the substrate;

masking the epitaxial layer to expose portions of the epitaxial layer which define a well region;

implanting the second conductivity-type dopant into a well region;

forming a single patterned nitride layer over the epitaxial layer with openings which define both channel stop regions of a CMOS device and a base link region for linking an extrinsic base with a base contact of a bipolar device;

implanting a CMOS field implant region and the bipolar base link region using the patterned nitride layer as a mask; and forming an oxide layer in exposed regions of the epitaxial layer not covered by the nitride layer.

8. The method of claim 7 further comprising the steps of:

forming a polysilicon layer over said oxide layer; and patterning an emitter area from said polysilicon layer using said oxide layer as an etch end-point.

9. The method of claim 8, wherein said first conductivity-type dopant is p-type and said second conductivity-type dopant is n-type.

10. The method of claim 8, wherein said oxide layer defines an extrinsic base area of the bipolar device.

11. The method of claim 8 further comprising the step of:

heating the substrate to drive the second conductivity-type dopant through the epitaxial layer and into contact with the second conductivity-type dopant in the buried layer region.

12. The method of claim 7, wherein said patterned nitride layer is used to define field implant regions of CMOS devices, said step of implanting said CMOS field implant region and said bipolar base link region further comprising the steps of:

implanting the first conductivity-type dopant into the field implant region; and implanting, at the same time, the first conductivity-type dopant into the base link region.

13. The method of claim 12, wherein said first conductivity-type dopant is p-type and said second conductivity-type dopant is n-type.

14. A BiCMOS device having a bipolar device and a CMOS device formed on a common semiconductor substrate comprising:

a field implant channel stop located between the CMOS device and the bipolar device;

an extrinsic base located beneath emitter of the bipolar device;

a base link located between a base contact of the bipolar device and said emitter of the bipolar device for conductively connecting said base contact with said extrinsic base;

an oxide layer formed over at least a portion of said field implant channel stop and over at least a portion of said base link; and a bipolar device emitter patterned over portions of said oxide layer.

15. The BiCMOS device of claim 14 further comprising:

a dopant of the same conductivity type and dose implanted in said field implant channel stop and said base link.

16. The BiCMOS device of claim 14 further comprising:

an extrinsic base of said bipolar device formed in self-alignment in a portion of said substrate exposed by said oxide layer.

17. The BiCMOS device of claim 14, said oxide layer further comprising:

a portion formed over said field implant channel stop of said CMOS device and over a portion of said substrate in which an extrinsic base of said bipolar device is formed.

* * * * *